United States Patent
Wang et al.

(10) Patent No.: US 7,370,920 B2
(45) Date of Patent: May 13, 2008

(54) ANTI-TORQUE LOAD CAPTIVE BEARINGS

(75) Inventors: Jianhong Wang, Singapore (SG);
Wenming Yang, Singapore (SG);
Alfred E. Barry, Jr., Atlanta, GA (US)

(73) Assignee: Central Industrial Supply Company, Fort Worth, TX (US)

( * ) Notice: Subject to any disclaimer, the term of this patent is extended or adjusted under 35 U.S.C. 154(b) by 173 days.

(21) Appl. No.: 11/298,990

(22) Filed: Dec. 9, 2005

(65) Prior Publication Data

US 2007/0132347 A1    Jun. 14, 2007

(51) Int. Cl.
*A47B 88/00* (2006.01)
(52) U.S. Cl. .............................. 312/334.11; 312/334.17
(58) Field of Classification Search ............. 312/334.9, 312/334.11, 334.12, 334.15, 334.16, 334.17, 312/334.25, 334.26, 334.33, 334.37, 334.38, 312/334.45, 334.7
See application file for complete search history.

(56) References Cited

U.S. PATENT DOCUMENTS

| | | | | |
|---|---|---|---|---|
| 2,889,179 A | * | 6/1959 | Gussack ........................ | 384/18 |
| 2,960,376 A | * | 11/1960 | Myers .................... | 312/334.11 |
| 3,904,254 A | * | 9/1975 | Hagen et al. ................. | 384/18 |
| 4,089,568 A | * | 5/1978 | Fall ............................... | 384/18 |
| 4,679,950 A | * | 7/1987 | Delmege et al. ............... | 384/18 |
| 4,696,582 A | | 9/1987 | Kasten | |
| 5,851,059 A | * | 12/1998 | Cirocco ................. | 312/334.11 |
| 5,938,340 A | | 8/1999 | Brodersen | |
| 6,158,123 A | | 12/2000 | Bryson | |
| 6,254,210 B1 | | 7/2001 | Parvin | |
| 6,378,968 B1 | * | 4/2002 | Weng ..................... | 312/334.11 |
| 6,379,045 B1 | | 4/2002 | Cirocco | |
| 6,390,575 B1 | | 5/2002 | Chen et al. | |
| 6,705,689 B2 | * | 3/2004 | Chen et al. ............ | 312/334.46 |
| 6,824,233 B2 | | 11/2004 | Chen et al. | |
| 6,986,557 B2 | * | 1/2006 | Kellenberger et al. . | 312/334.11 |
| 7,025,430 B2 | * | 4/2006 | Lauchner ............... | 312/334.44 |
| 7,213,896 B2 | * | 5/2007 | Chi ........................ | 312/334.8 |
| 2002/0140331 A1 | * | 10/2002 | Chen et al. ............ | 312/334.46 |
| 2003/0034720 A1 | * | 2/2003 | Milligan et al. ....... | 312/334.44 |
| 2004/0201340 A1 | * | 10/2004 | Chen et al. ............ | 312/334.46 |

FOREIGN PATENT DOCUMENTS

WO        2006135678        * 12/2006

* cited by examiner

*Primary Examiner*—Janet M. Wilkens
(74) *Attorney, Agent, or Firm*—Mark W. Handley

(57) ABSTRACT

A bearing drawer slide (10) has an inner slide member (16) which is slidably extensible from within an outer slide member (14). Captives bearings (28) have elongate bodies (29) for locating in fixed relation to a rearward end (20) of the inner slide member (16), disposed within the bearing spaces (48) between the inner slide member (16) and the outer slide member (14), with sides (31, 33) of the elongate bodies fitting against bearing races (36, 46) of the outer and inner slide members (14, 16). The captive bearings (28) are moveable with the inner slide member (16) relative to the outer slide member (14), and prevent movement of the rearward end (20) of the inner slide member (16) relative to the outer slide member (14) in directions which are transverse to the directions in which inner slide member (14) extends relative to the outer slide member (16), particularly when the inner slide member (14) is fully retracted within the outer slide member (16).

18 Claims, 4 Drawing Sheets

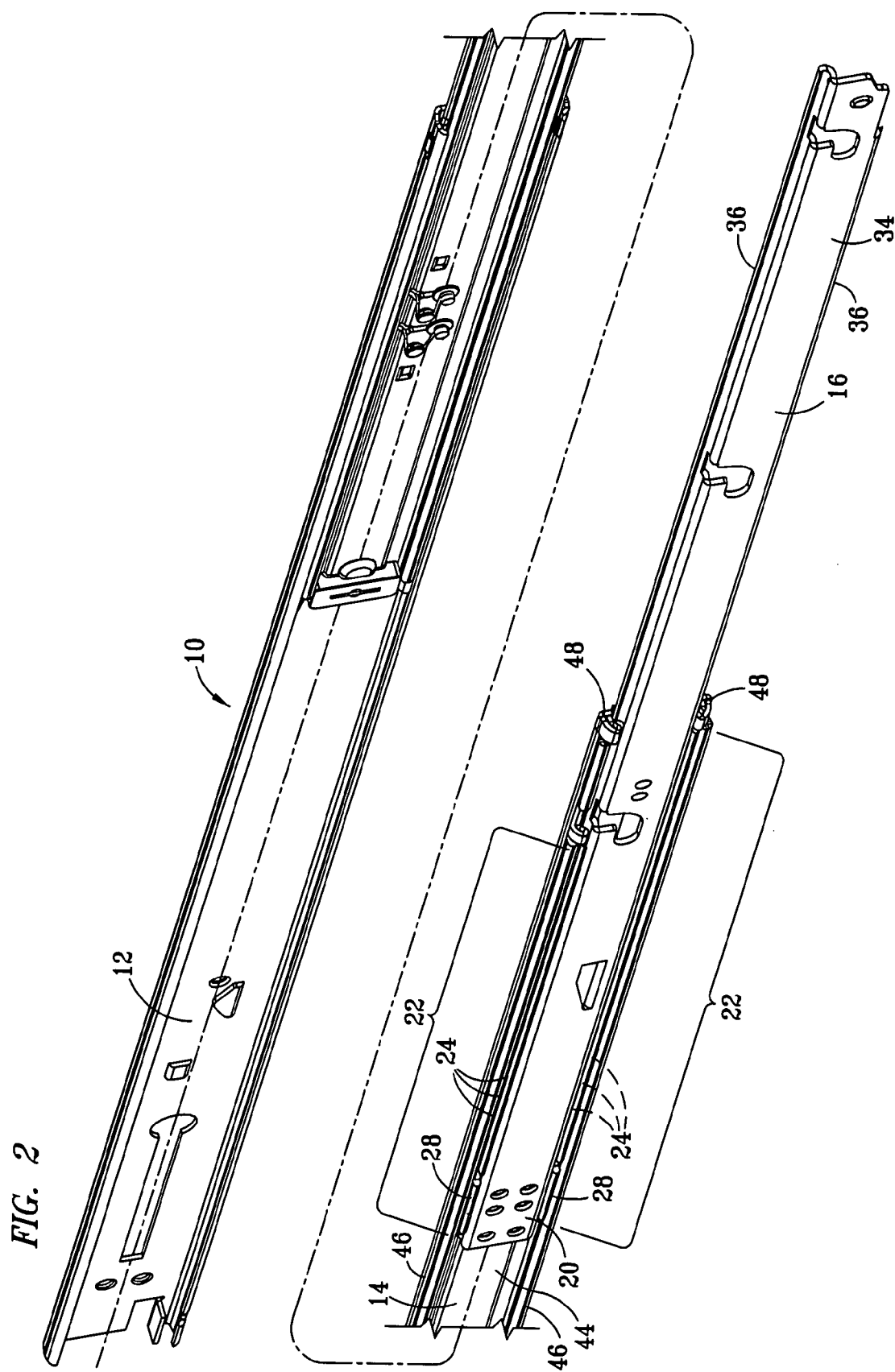

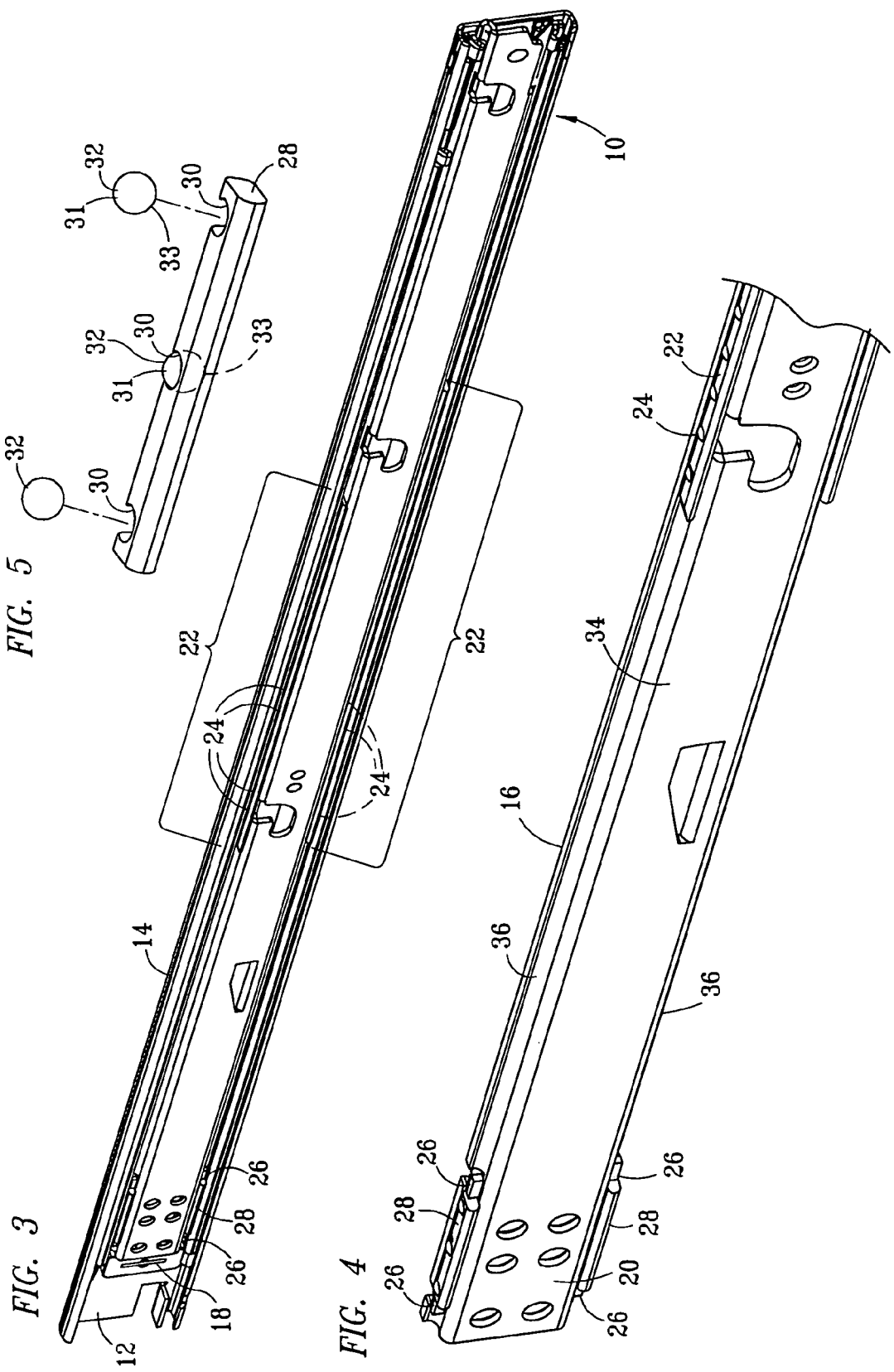

ANTI-TORQUE LOAD CAPTIVE BEARINGS

TECHNICAL FIELD OF THE INVENTION

The present invention relates in general to drawer slides, and in particular to a captive bearing held between edges of adjacent slide members which define bearing races.

BACKGROUND OF THE INVENTION

Prior art drawer slides have included two and three part drawer slides. Three-part bearing type drawer slides have included a cabinet member, and intermediate member and a chassis member, each having edges which define bearing races. Adjacent bearing races are spaced apart to define bearing spaces for receiving bearings there-between, such as for ball bearings, or bearing cages. The bearings are preferably spaced apart in fixed relation to one another along one of the edges by bearing retainers. As the chassis member is removed from within the intermediate member, the bearings and the bearing retainer move to a forward position in relation to the intermediate member, and are disposed adjacent a rearwardly disposed portion of the chassis member. When the chassis member is moved for retracting into the intermediate member, the bearings and the bearing retainer will move to an intermediate or forward position within the intermediate member, and are disposed adjacent an intermediate portion or a forward portion of the chassis member. This occurs due to a rolling engagement between the bearings and the respective edges of the intermediate member and the chassis member. Ball bearings and the bearing races in linear slides are free to travel back and forth through out the length of the slide. The act of sliding one member causes the balls in contact with that member to rotate, thus the bearings and races move in the same linear direction as the moving slide member. When the moveable slide member is returned to its starting position the bearings, captive in the races, also return to the starting position. Once again they are driven by the movement of the member, similar to a pinion moving on a rack. But rather than being driven by teeth engaging, the balls are driven by the friction of engagement with the slide member linear bearing race surface.

When a bearing drawer slide is fully retraced into a cabinet within which it is mounted, movement of the bearings away from the rearward end of a cabinet member will leave some free-play between a load carrying cabinet member and an intermediate member since the bearings are disposed between intermediate portions along the lengths of the intermediate member and the chassis member. Any large torque or bending moment applied on the opposite end of the sliding member can result in the slide members separating. This problem is especially acute in very long length slides and applications that require longer slides and when drawer slides are made of lighter weight materials. Separation of the slide members can result in the edges of the rearward end of a chassis member jumping out of engagement between the edges of the rearward end of an intermediate member, causing failure of the slide. For bearing drawer slides used in computer and telecommunications servers, the edges of a chassis member may jump out of engagement from within the edges of an intermediate member when force is applied to install cable management arms to the rearward ends of the drawer slide and a chassis.

SUMMARY OF THE INVENTION

A captive set of bearings are provided at the extreme end of a chassis member. These captive bearings remain engaged between the edges of a chassis member and an adjacent intermediate member, preventing a torque load at the back end of the chassis member from causing a separation of the slide. In one application, the captive bearings are secured within a bearing type drawer slide to prevent movement of rearward ends of inter-fitting slide members of the drawer slide when the drawer slide is disposed in a closed, or non-extended position. The drawer slide is preferably a three-part drawer slide, having a cabinet member, an intermediate member and a chassis member which have longitudinally extending edges which define bearing races, or raceways. The bearing races are spaced apart from adjacent bearing races to define bearing spaces within which bearings are received for supporting respective ones of the intermediate member and the cabinet member when extended and retracted to telescopically extend and retract the drawer slide. Bearing assemblies provide the bearings for fitting between bearing races of respective ones of the cabinet member and the intermediate member, and the intermediate member and the chassis member. The bearing assemblies preferably comprise a bearing retainer, or bearing cage, and bearings, such as ball bearings. The captive bearings are preferably located in fixed relation to a rearward end portion of the chassis member, disposed within the bearing spaces extending between the chassis member and the intermediate member. The captive bearings have elongate bodies with longer lengths that extend along the lengths of the bearing races of the chassis member, and sides which engage respective ones of the chassis member bearing races and the intermediate member bearing races. The captive bearings may be either solid members, or include spaced apart apertures for receiving moveable bearing members, such as ball bearings, for rotatably engaging the intermediate member bearing races.

DESCRIPTION OF THE DRAWINGS

For a more complete understanding of the present invention and the advantages thereof, reference is now made to the following description taken in conjunction with the accompanying Drawings in which FIGS. 1 through 6 show various aspects for captive bearings made according to the present invention, as set forth below:

FIG. 1 is a partial perspective view of a prior art drawer slide shown having a rearward and of a chassis member which has jumped-out of an intermediate member of the slide;

FIG. 2 is a perspective view of a drawer slide in which a captive bearing is mounted between edges of a rearward end of a chassis member and an intermediate member, with the drawer slide shown in a fully expended position;

FIG. 3 is a perspective view of the drawer slide of FIG. 2 disposed in a fully retraced position;

FIG. 4 is a partial perspective view of a rearward portion of the chassis member having two captive bearings;

FIG. 5 is an exploded view of one of the captive bearings; and

FIG. 6 is an exploded, partial perspective view of an alternative embodiment of a captive bearing for securing to the rearward end of a chassis member of a drawer slide.

DETAILED DESCRIPTION OF THE INVENTION

Figure 1:
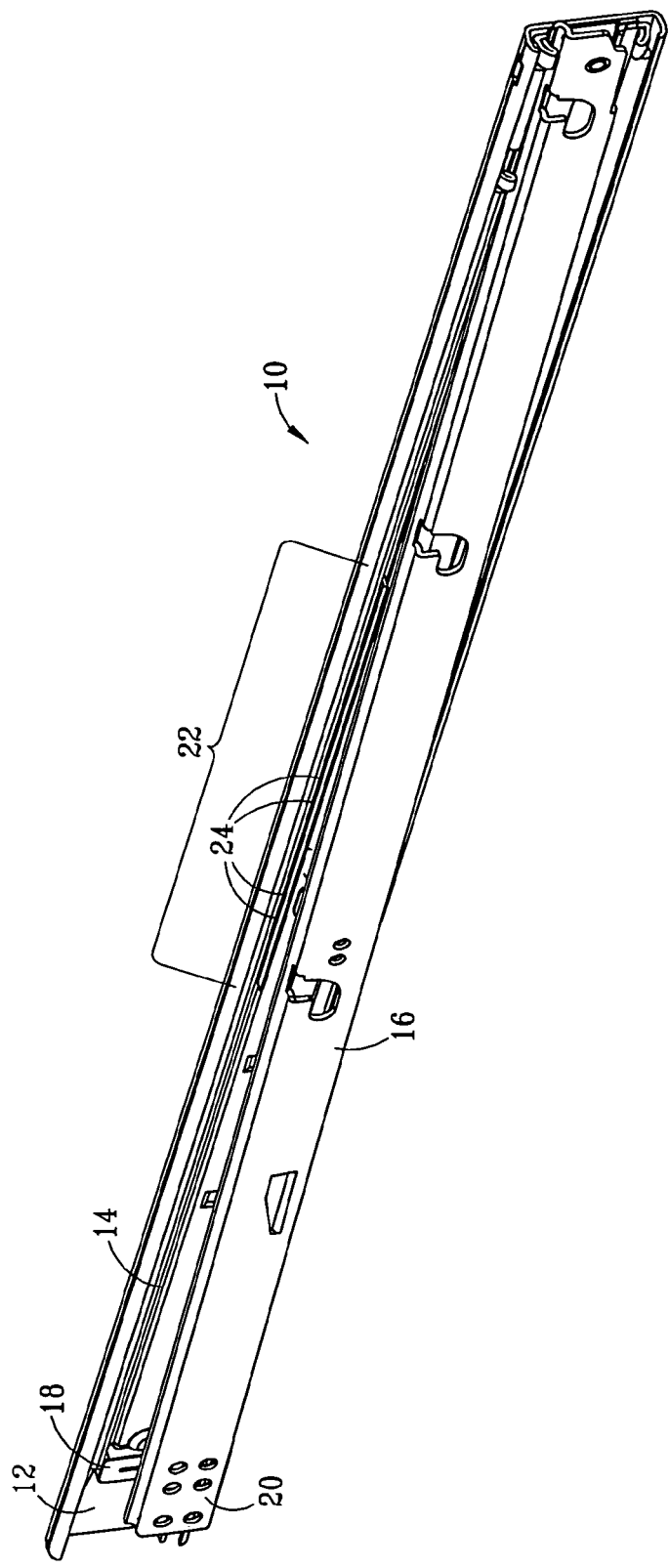

FIG. 1 is a partial perspective view of a three-part drawer slide 10 having a cabinet member 12, an intermediate member 14 and a chassis member 16, for supporting a chassis or a drawer for extending from within a cabinet or rack in a cantilevered manner. The intermediate member 14 is slidably extensible from within and retractable into the cabinet member 12, such that the intermediate defines an inner slide member for moving relative to the cabinet member 12, which defines an outer member relative to the intermediate member 14. Similarly, the chassis member 16 is slidably extensible from within and retractable into the intermediate member 14, such that the chassis member 16 defines an inner member for moving relative to the intermediate member 14, which in defines an outer slide member relative to the chassis member 16. The drawer slide 10 is shown in a fully retracted position with a rearward end 20 of the chassis member 16 disposed adjacent to a stop 18. A bearing retainer 22 disposed bearings 24 in spaced apart alignment between the intermediate member 14 and the chassis member 16. A prior art arrangement between the intermediate member 14 and the rearward end 20 is shown, in which the edges 36 of the rearward end 20 of the chassis member 16 have jumped-out of the edges 46 of the intermediate member 14.

FIG. 2 is a perspective view of a drawer slide 10 after it has been configured for receiving a captive bearing 28 between edges 36 of a rearward end 20 of the chassis member 16 and the edges 46 of the intermediate member 14, with the drawer slide 10 shown in a fully expended position. The edges 36 of the chassis member 16 are preferably formed at the rearward end 20 of the cabinet member 16 to define two stops 26 which capture the captive bearing 28 at the rearward end of the chassis member 16. The chassis member 16 has a web portion 34 and edges 36 on opposite sides of the web portion 34 which define bearing races. The intermediate member 14 has a web portion 44 and edged edges 46 on opposite side of the web portion 44 which define bearing races. The respective ones of the bearing races defined by edges 36 and 46 are spaced apart to define bearing spaces, for receiving bearings between the bearing races 36 and 46.

FIG. 3 is a perspective view of the drawer slide 10 of FIG. 2, shown disposed in a fully retraced position. The chassis member 16 has two captive bearing members 28 disposed adjacent the rearward end 20 of the chassis member 16. The rearward end 16 is disposed adjacent the stop member mounted to the rearward end of the intermediate member 14. The bearing retainer 22 is shown disposed adjacent to intermediate portions of the intermediate member 14 and the chassis member 16. The captive bearing members 28 will fit between the races defined by edges of respective ones of the intermediate member 14 and the chassis member 16, and prevent the rearward end 20 of the chassis member 16 from being removed from within the intermediate member 14.

FIG. 4 is a partial perspective view of a rearward portion of the chassis member 16 having two captive bearings 28. The two captive bearings 28 are held in place along the respective edges 36 of opposite sides of the chassis member 16 by two tabs 26 which are formed of portions of the respective edges 36, to provide locating protuberances 36 which extend alongside opposite ends of the captive bearings 28. Preferably, the tabs 26 are bent to extend at a right angle to the face of the edges 36 providing the bearing races for the chassis member 16. The tabs 26 locate the captive bearings 28 in relation to the chassis member 14, preventing the captive bearings 28 from moving along the length of the chassis member 16. The edges 36 of the chassis member and edges 46 of the intermediate members (shown in FIG. 2), along with sides of the web portions 34 and 44, will also contain the captive bearings 28 in fixed positions relative to the chassis member 16, once the chassis member 16 is inserted within the intermediate member 14 (shown in FIG. 2).

FIG. 5 is an exploded view of one of the captive bearings 28. The captive bearing 28 includes a lineally extending, elongate body having apertures 30 formed into the sides thereof. The apertures 30 are slots which extend into the body for receiving ball bearings 32, such that the bearings 32 are rotatably fitting within the apertures 30: The ball bearings 32 are retained within the apertures 30 once the captive bearings are inserted with the chassis member 16 into an intermediate member 14, and engage bearing races defined by edges 36 and edges 46 of the chassis member 16 and the intermediate member 14. In the embodiment shown, opposite edges 31 and 33 of the ball bearings 32 define opposite sides of the captive bearings 28 which engage against respective ones of the bearing races 36 and 46 defined by edges of the chassis member 14 and the intermediate member 16.

Figure 6:
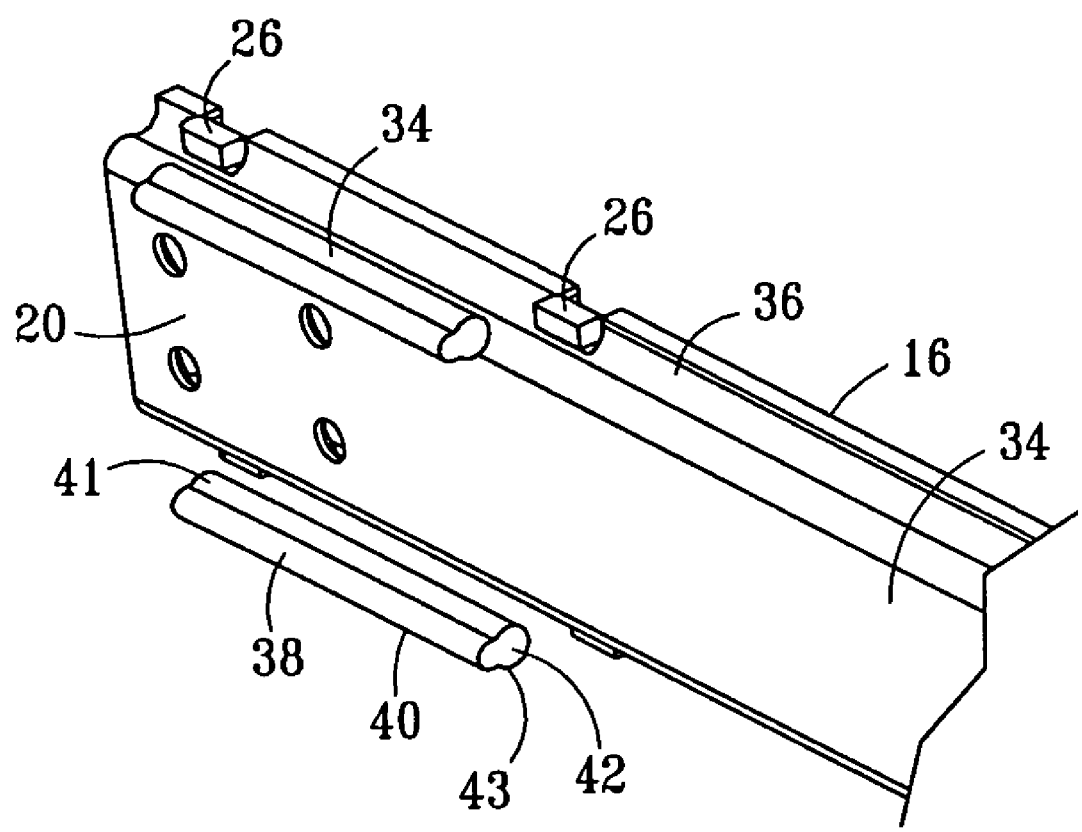

FIG. 6 is an exploded, partial perspective view of an end of the chassis member 14, with an alternative embodiment captive bearings 38 being secured between the locating tabs 26. The captive bearing 38 is preferably a solid bearing member for securing to the rearward end of a chassis member 14 of the drawer slide 10. Various type of materials for use in providing the captive bearing 38, such as bronze, brass, various plastics, and other materials which may be formed by molding, extruding, drawing, and such. The captive bearing 38 has an elongate body, with a first portion 42 and a second portion 40 which longitudinally extends with a smaller size than the first portion 42. The first portion 42 fits within bearing space 48 (shown in FIG. 2) to engage with the bearing races 36 and 46 of the chassis member 16 and the intermediate member 14. Preferably, the first portion 42 defines sides 41 and 43 of the captive bearing 38 which will engage flush with a surface area of the bearing races 36 and 46, preventing movement of the rearward end portion 20 of the chassis member 16 relative to the intermediate member 16 in directions which are transverse to the direction the chassis member 14 slidably extends from within the intermediate member 14, The present invention provides advantages of a captive member which is retained between edge bearing races of drawer slide members to prevent an inner member from jumping out of a member within which it is disposed when bearings are disposed relative to the inner member such that they are separated from an end of the inner member. As described herein, the captive bearing members are located at an inward end of a chassis member of a three-part bearing drawer slide, such that the inward end will not jump out of an intermediate member within which it is slidably disposed. This prevents chassis member jump out when attaching cable management arms to rearward ends of chassis members of drawer slides.

Although the preferred embodiment has been described in detail, it should be understood that various changes, substitutions and alterations can be made therein without departing from the spirit and scope of the invention as defined by the appended claims.

What is claimed is:

1. A drawer slide having a longitudinal length along which said drawer slide is telescopically extensible, said drawer slide comprising;

an outer slide member having an outer slide member web portion and two outer slide member edges disposed on opposite sides of said outer slide member web portion, said two outer slide member edges defining outer slide member bearing races which extend substantially parallel to the longitudinal length of the drawer slide;

an inner slide member having an inner slide member web portion and two inner slide member edges disposed on opposite sides of said inner slide member web portion, said two inner slide member edges defining inner slide member bearing races which extend along the longitudinal length of the drawer slide, wherein said inner slide member bearing races are spaced apart from respective ones of said outer slide member bearing races to define bearing spaces;

a bearing assembly having a bearing retainer and a plurality of bearings retained in spaced apart relation by said bearing retainer, with said bearings disposed between respective ones of said spaced apart races of said inner slide member and said outer slide member, wherein said bearing assembly moves to a forward position relative to said inner slide member when said inner slide member is extended from within said outer slide member along the longitudinal length;

two pairs of locating protuberances, each pair of locating protuberances extending adjacent to a respective one of said two inner slide member edges, spaced apart in fixed relation to said inner slide member bearing races, wherein said locating protuberances are disposed near a rearward portion of said inner slide member; and two captive bearings disposed between in respective ones of said bearing spaces between spaced apart ones of said outer bearing races and said inner slide member bearing races, with each of said captive bearings disposed on opposite sides of said inner slide member web portion, and captured between respective ones of said two pairs of locating tabs.

2. The drawer slide according to claim 1, wherein, said two captive bearings each comprise elongate bodies having sides which slidably fit against respective ones of said outer slide member bearing races.

3. The drawer slide according to claim 1, wherein said captive bearings each comprises an elongate body having a plurality of apertures sized for moveably receiving respective ones of a plurality of movable bearing members and spaced apart in a direction parallel to the longitudinal length of said drawer slide; and a plurality of moveable bearing members.

4. The drawer slide according to claim 3, wherein, said moveable bearing members comprise ball bearings.

5. The drawer slide according to claim 1, wherein said captive bearings each comprise elongate bodies having sides which slidably fit against respective ones of said outer slide member bearing races, and which engage respective ones of said inner slide member bearing races, with said elongate bodies longitudinally extending substantially parallel to a longitudinal length of said drawer slide.

6. The drawer slide according to claim 5, wherein said captive bearings are solid bearing members.

7. The drawer slide according to claim 6, wherein said elongate bodies of said captive bearings have sides which are shaped to engage flush with surface portions of said inner slide member bearing races and said outer slide member bearing races.

8. The drawer slide according to claim 7, wherein said drawer slide is a three part drawer slide, having a cabinet member, said inner slide member and said outer slide member which comprises an intermediate member.

9. A drawer slide having a longitudinal length along which said drawer slide is telescopically extensible, said drawer slide comprising;

an outer slide member having an outer slide member web portion and two outer slide member edges disposed on opposite sides of said outer slide member web portion, said two outer slide member edges defining outer slide member bearing races which extend substantially parallel to the longitudinal length of the drawer slide;

an inner slide member having an inner slide member web portion and two inner slide member edges disposed on opposite sides of said inner slide member web portion, said two inner slide member edges defining inner slide member bearing races which extend along a longitudinal length of the drawer slide, wherein said inner slide member bearing races are spaced apart from respective ones of said outer slide member bearing races to define bearing spaces;

a bearing assembly having a bearing retainer and a plurality of bearings retained in spaced apart relation by said bearing retainer, with said bearings disposed between respective ones of said spaced apart races of said inner slide member and said outer slide member, wherein said bearing assembly moves to a forward position relative to said inner slide member when said inner slide member is extended from within said outer slide member along the longitudinal length;

two pairs of locating protuberances, each pair of locating protuberances formed from a portion of said inner slide member and extending adjacent to a respective one of said two inner slide member edges, spaced apart in fixed relation to said inner slide member bearing races, wherein said locating protuberances are disposed near a rearward portion of said inner slide member; and two captive bearings having elongate bodies with opposite sides which are shaped to fit with respective ones of said bearing spaces, engaging with surface portions of respective ones of said outer slide member bearing races and said inner slide member bearing races, and wherein each of said captive bearings is disposed on opposite sides of said inner slide member web portion with longer lengths of said elongate bodies extending substantially parallel to the longitudinal length of said drawer slide, with ends of said captive bearings disposed adjacent respective ones of said two pairs of locating tabs to capture said two captive bearings to prevent movement of said two captive bearings relative to said inner slide member.

10. The drawer slide according to claim 9, wherein, one side of each of said two captive bearings slidably fit against respective ones of said outer slide member bearing races.

11. The drawer slide according to claim 9, wherein said elongate bodies of each of said captive bearings have a plurality of apertures sized for moveably receiving respective ones of a plurality of movable bearing members, wherein said plurality of apertures are spaced apart in a direction extending substantially parallel to the longitudinal length of said drawer slide; and a plurality of moveable bearing members.

12. The drawer slide according to claim 11, wherein, said moveable bearing members comprise ball bearings.

13. The drawer slide according to claim 9, wherein said captive bearings are solid bearing members, and said sides of said captive bearings fit flush with surface portions of said inner slide member bearing races and said outer slide member bearing races.

14. The drawer slide according to claim 13, wherein said drawer slide is a three part drawer slide, having a cabinet member, said inner slide member and said outer slide member which comprises an intermediate member.

15. A drawer slide having a longitudinal length along which said drawer slide is telescopically extensible, said drawer slide comprising;
- a cabinet member having a cabinet member web portion and two cabinet member edges disposed on opposite sides of said cabinet member web portion, said two cabinet member edges defining cabinet member bearing races which extend substantially parallel to the longitudinal length of the drawer slide;
- an intermediate member having an intermediate member web portion and two intermediate member edges disposed on opposite sides of said intermediate member web portion, said two intermediate member edges defining intermediate member bearing races defined to extend on opposite sides of said intermediate edges, substantially parallel to the longitudinal length of the drawer slide, wherein one side of each of said intermediate edges define a set of intermediate bearing races which are spaced apart from said cabinet member bearing races to define outer bearing spaces;
- a chassis member having a chassis member web portion and two chassis member edges disposed on opposite sides of said chassis member web portion, said two chassis member edges defining chassis member bearing races which extend along a longitudinal length of the drawer slide, wherein said chassis member bearing races are spaced apart from respective ones of said intermediate member bearing races to define bearing spaces;
- a bearing assembly having a bearing retainer and a plurality of bearings retained in spaced apart relation by said bearing retainer, with said bearings disposed between respective ones of said spaced apart races of said chassis member and said intermediate member, wherein said bearing assembly moves to a forward position relative to said chassis member when said chassis member is extended from within said intermediate member along the longitudinal length;
- two pairs of locating protuberances, each pair of locating protuberances formed from a portion of said chassis member and extending adjacent to a respective one of said two chassis member edges, spaced apart in fixed relation to said chassis member bearing races, wherein said locating protuberances are disposed near a rearward portion of said chassis member; and
- two captive bearings having elongate bodies with opposite sides which are shaped to fit with respective ones of said bearing spaces, engaging with surface portions of respective ones of said intermediate member bearing races and said chassis member bearing races, and wherein each of said captive bearings is disposed on opposite sides of said chassis member web portion with longer lengths of said elongate bodies extending substantially parallel to the longitudinal length of said drawer slide, with ends of said captive bearings disposed adjacent respective ones of said two pairs of locating tabs to capture said two captive bearings to prevent movement of said two captive bearings relative to said chassis member.

16. The drawer slide according to claim 15, wherein, one side of each of said two captive bearings slidably fit against respective ones of said intermediate member bearing races.

17. The drawer slide according to claim 15, wherein said elongate bodies of each of said captive bearings have a plurality of apertures sized for moveably receiving respective ones of a plurality of ball bearings, wherein said plurality of apertures are spaced apart in a direction extending substantially parallel to the longitudinal length of said drawer slide; and
a said plurality of ball bearings.

18. The drawer slide according to claim 15, wherein said captive bearings are solid bearing members, and said sides of said captive bearings fit flush with surface portions of said chassis member bearing races and said intermediate member bearing races.

* * * * *